(12) United States Patent
Piscitelli et al.

(10) Patent No.: US 12,706,117 B1
(45) Date of Patent: Aug. 11, 2026

(54) ARCHITECTURE FOR DC BIAS CANCELING AND GAIN RECOVERY FOR HARD DISK DRIVE FLY HEIGHT DETECTION

(71) Applicant: STMicroelectronics International N.V., Geneva (CH)

(72) Inventors: Francesco Piscitelli, Milan (IT); Alessio Emanuele Vergani, Milan (IT); Dario Livornesi, Milan (IT)

( * ) Notice: Subject to any disclaimer, the term of this patent is extended or adjusted under 35 U.S.C. 154(b) by 0 days.

(21) Appl. No.: 19/050,746

(22) Filed: Feb. 11, 2025

(51) Int. Cl.
*G11B 5/60* (2006.01)
*G11B 5/012* (2006.01)
*G11B 5/00* (2006.01)
*H03F 3/45* (2006.01)

(52) U.S. Cl.
CPC ............ *G11B 5/607* (2013.01); *G11B 5/6076* (2013.01); *G11B 2005/0008* (2013.01); *H03F 3/45475* (2013.01)

(58) Field of Classification Search
CPC ....... G11B 5/6017; G11B 5/607; G11B 5/012; G11B 27/36; G11B 5/00; G11B 5/48; G11B 5/58; G11B 5/60; G11B 5/6005; G11B 5/6011; G11B 27/00; G11B 5/6029
USPC .............................................. 360/65, 67, 68
See application file for complete search history.

(56) References Cited

U.S. PATENT DOCUMENTS 10,965,254 B2 3/2021 Moretti
11,922,979 B2 * 3/2024 Mazzini .................. H05B 3/22
2008/0291564 A1 11/2008 Tang
2013/0176639 A1 7/2013 Polley
2014/0268386 A1 9/2014 Li
2019/0372529 A1 12/2019 Moretti
2023/0386514 A1 11/2023 Livornesi
2024/0177732 A1 5/2024 Mazzini

* cited by examiner

*Primary Examiner* — Nabil Z Hindi
(74) *Attorney, Agent, or Firm* — Slater Matsil, LLP

(57) ABSTRACT

According to an embodiment, a system for processing signals from a resistive sensor that monitors spacing between a disk drive head and disk surface includes a bias-canceling digital-to-analog converter and a translinear cell. The bias-canceling digital-to-analog converter generates a cancelation current equal to a bias current across the resistive sensor. The translinear cell receives the cancelation current and a composite current comprising the bias current and a sensor signal current, where the sensor signal current corresponds to variations in thermal conductivity as the disk drive head approaches the disk surface. The translinear cell generates differential output currents proportional to a sensing voltage while eliminating dependence on resistance value of the resistive sensor. A front-end circuit combines these differential output currents with signals coupled directly from sensor nodes at frequencies above a bias loop bandwidth.

20 Claims, 5 Drawing Sheets

ARCHITECTURE FOR DC BIAS CANCELING AND GAIN RECOVERY FOR HARD DISK DRIVE FLY HEIGHT DETECTION

TECHNICAL FIELD

The present disclosure generally relates to electronic systems and, in particular embodiments, to an architecture for DC bias canceling and gain recovery for hard disk drive fly height detection.

BACKGROUND

Hard disk drives store and retrieve data through magnetic heads that float above rapidly spinning disk surfaces. The spacing between the head and disk surface, known as fly height, can range from 10-20 nanometers during normal operation. A thermal actuation system in the head can reduce this spacing to approximately 1 nanometer by creating controlled mechanical deformation through localized heating. This reduced spacing enhances the magnetic coupling between the head and disk surface, enabling higher recording densities and improved signal quality.

The head assembly can incorporate multiple specialized elements, including read/write transducers, a resistive temperature sensor, and a thermal actuator. The temperature sensor monitors head-to-disk spacing by detecting changes in thermal conductivity as the head approaches the disk surface. As the spacing decreases, heat dissipation through the air gap increases, causing measurable changes in the sensor resistance. However, the sensor resistance can vary with temperature and exhibit manufacturing variations between devices.

Signal processing circuits in the drive's preamplifier condition the small analog signals from the temperature sensor to enable precise spacing control. These circuits apply a bias voltage across the sensor and amplify the resulting signals through multiple gain and filter stages. The bias circuitry establishes a stable operating point while compensating for resistance variations. Filtering networks separate the relevant spacing information from noise and unwanted frequency components.

The preamplifier's analog front-end faces several key challenges in processing the sensor signals. The variable and temperature-dependent nature of the sensor resistance can complicate maintaining consistent gain and frequency response. DC bias voltages are carefully managed to prevent saturation in the amplifier stages. The circuits can achieve a flat frequency response from DC to hundreds of kilohertz while rejecting noise and interference.

Reliable fly height control depends on accurately processing the temperature sensor signals across all operating conditions. Excessive spacing between the head and disk degrades read/write performance and increases error rates. Insufficient spacing risks catastrophic damage from head-disk contact.

SUMMARY

Technical advantages are generally achieved by embodiments of this disclosure, which describe an architecture for DC bias canceling and gain recovery for hard disk drive fly height detection.

A first aspect relates to a system for processing signals from a resistive sensor that monitors spacing between a disk drive head and a disk surface, the system comprising a bias-canceling digital-to-analog converter configured to generate a cancelation current, the cancelation current equal to a bias current across the resistive sensor; and a translinear cell configured to receive the cancelation current and a composite current comprising the bias current and a sensor signal current, wherein the sensor signal current corresponds to variations in thermal conductivity as the disk drive head approaches the disk surface, and generate an output current proportional to a sensing voltage across the resistive sensor to eliminate dependence on resistance value of the resistive sensor.

A second aspect relates to a circuit for monitoring spacing between a disk drive head and a disk surface using a resistive sensor that detects variations in thermal conductivity as the disk drive head approaches the disk surface, the circuit comprising a first transistor configured to receive a cancelation current, wherein the cancelation current is equal to a bias current flowing through the resistive sensor; a second transistor and a third transistor coupled to a first output node and a second output node, respectively; and a fourth transistor receiving a composite current comprising the bias current and a sensor signal current from the resistive sensor, wherein the first transistor, the second transistor, the third transistor, and the fourth transistor are arranged in a translinear configuration to generate differential output currents proportional to a sensing voltage while eliminating dependence on resistance value of the resistive sensor.

A third aspect relates to a method for monitoring spacing between a disk drive head and a disk surface using a resistive sensor, the method comprising establishing a bias voltage across the resistive sensor through a voltage feedback loop to generate a bias current; generating a cancelation current equal to the bias current; receiving, at a translinear cell, the cancelation current and a composite current comprising the bias current and a sensor signal current, wherein the sensor signal current corresponds to variations in thermal conductivity as the disk drive head approaches the disk surface; generating, by the translinear cell, differential output currents proportional to a sensing voltage across the resistive sensor while eliminating dependence on resistance value of the resistive sensor; and processing the differential output currents to determine the spacing between the disk drive head and the disk surface.

Embodiments can be implemented in hardware, software, or any combination thereof.

BRIEF DESCRIPTION OF THE DRAWINGS

For a more complete understanding of the present disclosure and the advantages thereof, reference is now made to the following descriptions taken in conjunction with the accompanying drawings, in which.

DETAILED DESCRIPTION OF ILLUSTRATIVE EMBODIMENTS

Figure 1:
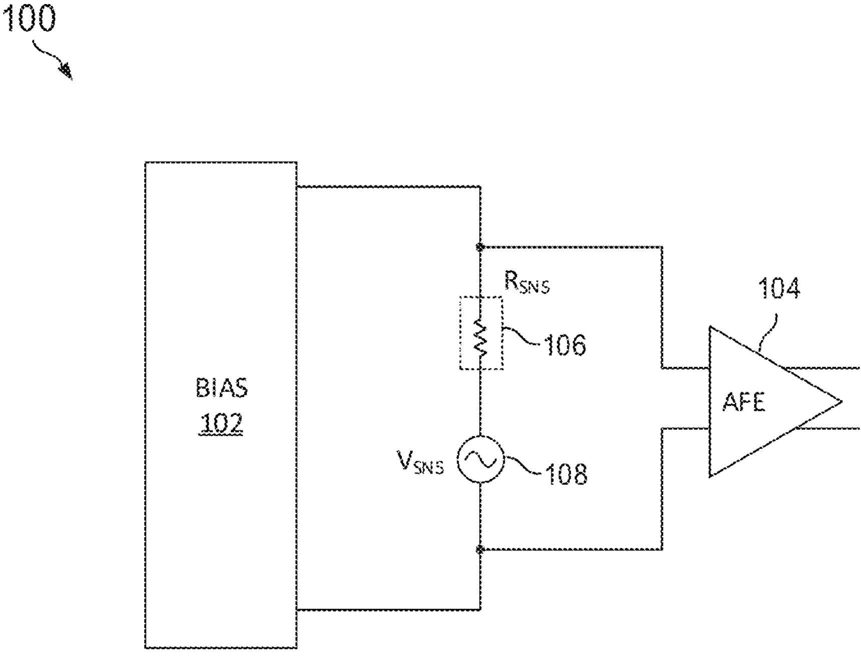
FIG. 1 is a block diagram of a circuit for biasing a resistive sensor ($R_{SNS}$) and reading the voltage signal ($V_{SNS}$)

This disclosure provides many applicable inventive concepts that can be embodied in a wide variety of specific contexts. The particular embodiments are merely illustrative of specific configurations and do not limit the scope of the claimed embodiments. Features from different embodiments may be combined to form further embodiments unless noted otherwise. Various embodiments are illustrated in the accompanying drawing figures, where identical components and elements are identified by the same reference number, and repetitive descriptions are omitted for brevity.

Variations or modifications described in one of the embodiments may also apply to others. Further, various changes, substitutions, and alterations can be made herein without departing from the spirit and scope of this disclosure as defined by the appended claims.

While the inventive aspects are described primarily in the context of hard disk drive preamplifier circuits for fly height sensing and control, it should also be appreciated that these inventive aspects may also apply to other sensor signal processing applications requiring bias cancelation and temperature-independent gain. In particular, aspects of this disclosure may similarly apply to analog front-end circuits processing signals from variable resistance sensors where the sensor resistance changes with temperature and manufacturing variations while requiring precise signal conditioning independent of those variations.

In embodiments, a signal processing architecture processes resistive sensor signals while maintaining gain stability across temperature and manufacturing variations of circuits and sensors. The architecture includes a bias stage, a translinear cell, a bias cancelation circuit, and signal combining networks. The bias stage establishes an operating point for a resistive temperature sensor through a voltage feedback loop operating up to several kilohertz bandwidth. The translinear cell processes currents derived from the sensor bias and signal variations to generate output signals and amplification independent of sensor resistive value.

In embodiments, separate signal paths are employed for different frequency ranges. A low-frequency path processes signals within the bias loop bandwidth through the translinear cell, converting sensor currents to resistance-independent output signals. A high-frequency path directly amplifies signals above the bias bandwidth. The paths combine to provide continuous frequency coverage from DC to hundreds of kilohertz while maintaining consistent gain. A programmable current DAC enables precise bias cancelation to prevent saturation in subsequent gain stages.

Aspects of the disclosure include a translinear cell that receives multiple current inputs, including a bias current proportional to the sensor operating point, a signal current representing sensor variation, and a programmable cancelation current. By configuring this current, the cell generates output currents directly proportional to sensor voltage variations while eliminating dependence on the sensor's resistance value. This current-mode signal processing approach accommodates sensor resistance variations without requiring direct resistance measurement or compensation.

The bias cancelation current can be automatically calibrated by monitoring the differential outputs of the translinear cell. When these outputs are balanced, the cancelation current matches the sensor bias current, enabling accurate bias removal. The architecture maintains this calibration across temperature variations through the inherent properties of the translinear cell configuration rather than through complex compensation schemes. These and additional details are further discussed below.

FIG. 1 illustrates a block diagram of a circuit 100 for biasing a resistive sensor ($R_{SNS}$) 106 and reading the voltage signal ($V_{SNS}$) 108. Circuit 100 includes a biasing circuit 102 and an analog front-end (AFE) circuit 104 coupled to the resistive sensor ($R_{SNS}$) 106, which may (or may not) be arranged as shown. Circuit 100 may include additional components not shown. A possible implementation of circuit 100 is provided in U.S. Pat. No. 10,965,254, which is incorporated herein by reference in its entirety.

Maintaining precise spacing between the read/write head and the disk surface in hard disk drive systems impacts drive performance. A heater element in the head assembly can elevate the temperature of a portion of the flying head, causing thermal distortion that reduces the separation between the active read/write elements and the disk surface. This thermal actuation can reduce the normal separation of 10-20 nanometers to approximately 1 nanometer for optimum performance. Operating at larger spacings leads to excessive read and write errors, while insufficient spacing risks catastrophic damage from head-disk contact.

In embodiments, the resistive sensor ($R_{SNS}$) 106, implemented as a thermal conductivity sensor, monitors this critical head-disk spacing. When placed on the read/write head assembly, the resistive sensor ($R_{SNS}$) 106 exhibits resistance variations as the head approaches the disk surface, which acts as a heat sink. These resistance changes generate the voltage signal ($V_{SNS}$) that indicates the relative spacing between the head and the disk.

The analog front-end circuit 104 is configured to amplify the sensing voltage ($V_{SNS}$). The output of the analog front-end circuit 104 is coupled to a system-on-chip (SoC) controller that processes the amplified sensing voltage ($V_{SNS}$) to determine, for example, the fly height of the hard disk drive.

Processing signals from the resistive sensor ($R_{SNS}$) 106 enables monitoring head-disk contact and proximity. The voltage signal ($V_{SNS}$) requires filtering and amplification through low-noise analog front-end circuits to extract useful measurements. A flat transfer function with constant gain independent of the value of the resistive sensor ($R_{SNS}$) 106 from DC to hundreds of kilohertz is desirable.

Figure 2:
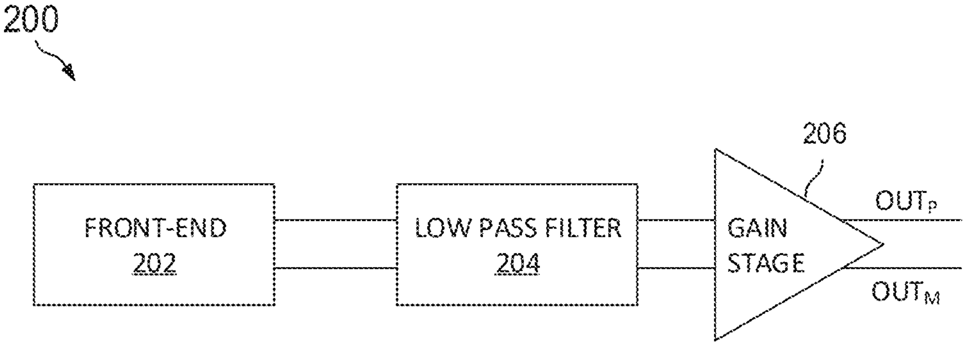
FIG. 2 is a block diagram of an embodiment circuit.

FIG. 2 illustrates a block diagram of an embodiment circuit 200. Circuit 200 includes a front-end circuit 202, a low-pass filter 204, and a gain stage 206, which may (or may not) be arranged as shown. Circuit 200 may include additional components not shown.

The biasing circuit 102 is coupled to the resistive sensor ($R_{SNS}$) 106 in a closed-loop configuration with a limited bandwidth. Below the closed-loop bandwidth, sensor signals are not available as voltages due to the bias loop's high-pass filter effect. Further, the bias voltage applied to the resistive sensor ($R_{SNS}$) 106 in the signal path is canceled before subsequent gain stages to prevent saturation.

In contrast, at the higher frequencies (e.g., from bias bandwidth up to megahertz), the sense voltage across the resistive sensor ($R_{SNS}$) 106 is provided as a differential input signal to the front-end circuit 202.

The front-end circuit 202 represents the signal path of the analog front-end circuit 104, shown in FIG. 1. Front-end circuit 202 amplifies the signal from the resistive sensor ($R_{SNS}$) 106 with a constant gain. The input signal to the front-end circuit 202 can range from DC to several megahertz. It is advantageous for the front-end circuit 202 to generate an output signal based on the variations of the resistive sensor ($R_{SNS}$) 106 with a flat transfer function and a constant gain independent of the resistive sensor ($R_{SNS}$) 106 value.

The output of front-end circuit 202 couples to low-pass filter 204. The low-pass filter 204 attenuates the high-frequency components while passing the desired low-frequency signals. The filtered signals then couple to gain stage 206, which amplifies the signal. The gain stage 206 amplifies the filtered signals to levels suitable for subsequent processing while maintaining linear operation.

Thus, while sensing voltage ($V_{SNS}$) signals higher than the bias bandwidth can be extracted, amplified, and processed, additional techniques may be implemented to process signals below the bias bandwidth from DC to the bias bandwidth limit.

Further, it is desirable to cancel the polarization bias across the resistive sensor ($R_{SNS}$) 106 to avoid signal saturation through circuit 200.

Prior approaches to processing low-frequency sensor signals include bias cancelation techniques described in related U.S. application Ser. No. 18/191,689, which is incorporated herein by reference in its entirety.

Figure 3:
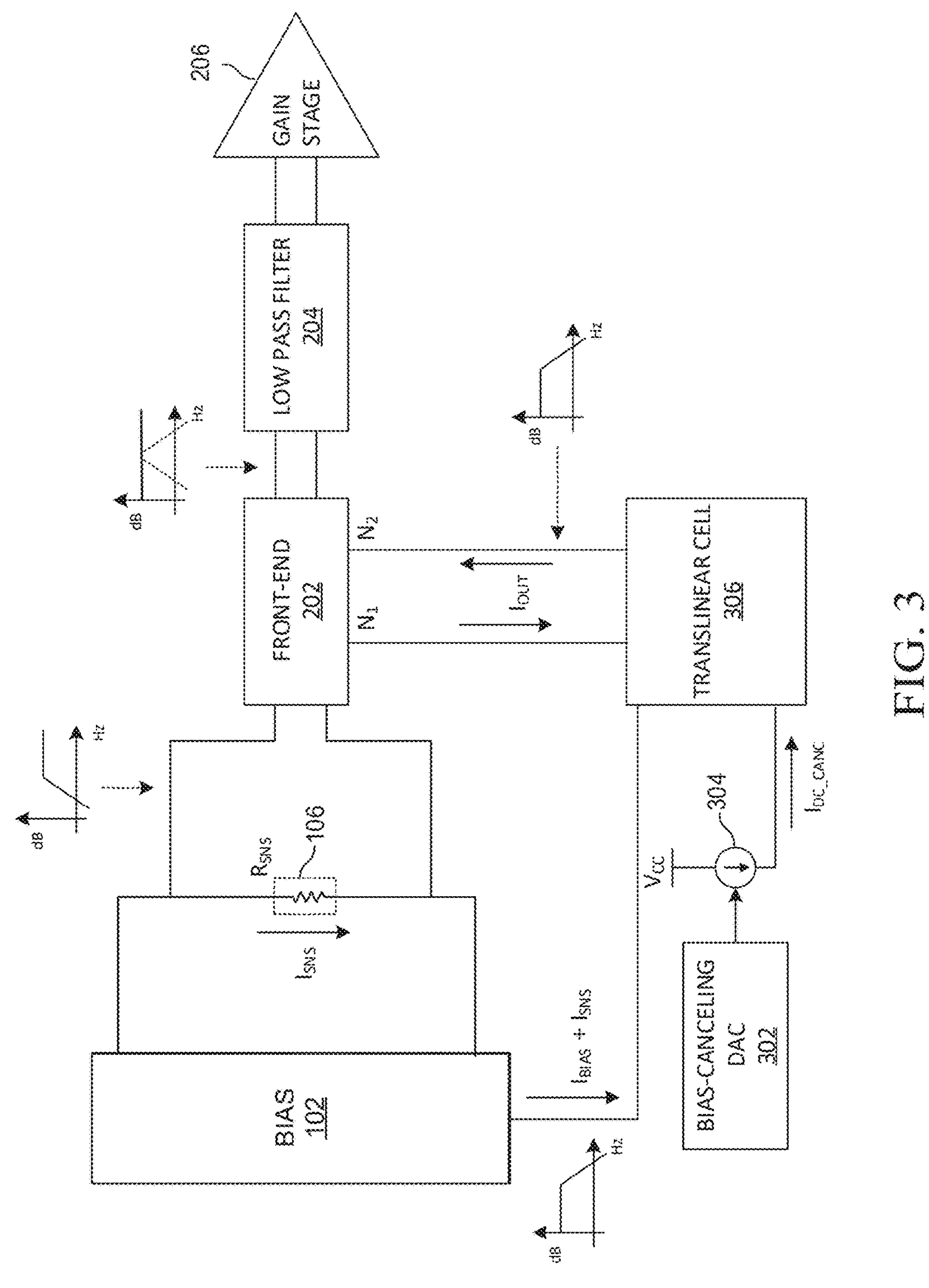
FIG. 3 is a block diagram of an embodiment circuit.

FIG. 3 illustrates a block diagram of an embodiment circuit 300. Circuit 300 includes the biasing circuit 102, the resistive sensor ($R_{SNS}$) 106, the front-end circuit 202, the low-pass filter 204, the gain stage 206, a bias-canceling digital-to-analog converter (DAC) 302, a current source 304, and a translinear cell 306, which may (or may not) be arranged as shown. Circuit 300 may include additional components not shown.

The biasing circuit 102 establishes an operating point for the resistive sensor ($R_{SNS}$) 106 through a voltage feedback loop. The bias current ($I_{BIAS}$) and sensor signal current ($I_{SNS}$)—flowing through resistive sensor 106—combine to form a composite current ($I_{BIAS}$+$I_{SNS}$) to translinear cell 306. The frequency response characteristics of these signal paths are indicated by the gain versus frequency plots shown adjacent to the signal paths.

The bias-canceling DAC 302 generates a cancelation current ($I_{DC\_CANC}$) that feeds into translinear cell 306 through current source 304. The translinear cell 306 processes these input currents (i.e., the cancelation current ($I_{DC\_CANC}$) and the composite current ($I_{BIAS}$+$I_{SNS}$) to generate an output current ($I_{OUT}$) that maintains proportionality to sensor signals while eliminating dependence on sensor resistance value. The differential output current ($I_{OUT}$) is provided to the front-end circuit 202 at the first node ($N_1$) and the second node ($N_2$).

The front-end circuit 202 combines the output current ($I_{OUT}$) from the translinear cell 306 with signals coupled directly from the sensor nodes at frequencies above the bias loop bandwidth (e.g., several kilohertz or greater) and amplified with a constant gain. The resulting differential signal is passed through the low-pass filter 204 and the gain stage 206. This architecture enables continuous frequency coverage from DC through hundreds of kilohertz (or megahertz) while maintaining consistent gain and preventing saturation from bias effects by cancelation of the polarization bias across the resistive sensor ($R_{SNS}$) 106 along the signal processing chain.

The gain versus frequency plots throughout the signal chain illustrate how the various blocks process and combine the signals across different frequency ranges to achieve the desired overall system response. The translinear cell 306 enables the recovery of low-frequency signals that would otherwise be lost within the bias loop bandwidth.

Figure 4:
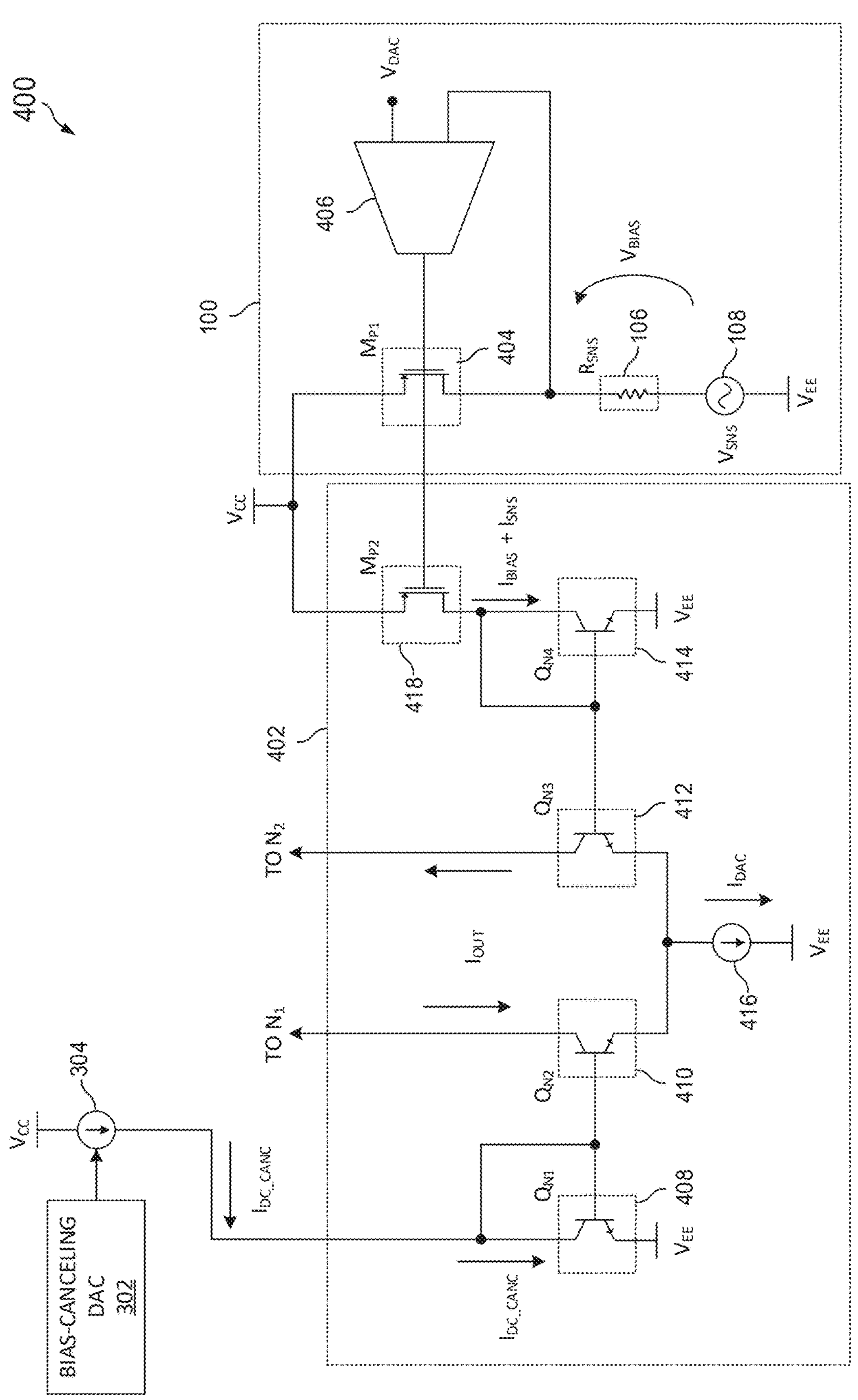
FIG. 4 is a schematic of an embodiment circuit.

FIG. 4 is a schematic of an embodiment circuit 400. Circuit 400 includes the bias-canceling DAC 302, the current source 304, a translinear cell 402, a first p-channel transistor ($M_{P1}$) 404, a biasing operational amplifier 406, and the resistive sensor ($R_{SNS}$) 106, which may (or may not) be arranged as shown. Circuit 400 may include additional components that are not shown.

The translinear cell 402 may be implemented as the translinear cell 306 of FIG. 3. The translinear cell 402 includes a first NPN transistor ($Q_{N1}$) 408, a second NPN transistor ($Q_{N2}$) 410, a third NPN transistor ($Q_{N3}$) 412, a fourth NPN transistor ($Q_{N4}$) 414, a current source 416, and a second p-channel transistor ($M_{P2}$) 418, which may (or may not) be arranged as shown. Translinear cell 402 may include additional components not shown.

The bias-canceling DAC 302 generates a programmable cancelation current ($I_{DC\_CANC}$) that flows through current source 304 into the first NPN transistor ($Q_{N1}$) 408. The cancelation current ($I_{DC\_CANC}$) is programmed to be equal to the bias current ($I_{BIAS}$)—corresponding to the differential output across the first output node ($N_1$) and the second output node ($N_2$) being equal to zero.

The current source 416 generates a current ($I_{DAC}$) proportional to the ratio of $V_{DAC}$ and $R_P$, where $R_P$ is a known resistance value and $V_{DAC}$ is the input voltage to the biasing operational amplifier 406. The biasing operational amplifier 406 establishes a bias voltage ($V_{BIAS}$) across the resistive sensor ($R_{SNS}$) 106 and is part of circuit 100.

The second NPN transistor ($Q_{N2}$) 410 and the third NPN transistor ($Q_{N3}$) 412 form differential outputs at the first output node ($N_1$) and the second output node ($N_2$), respectively. These outputs generate the differential output current ($I_{OUT}$) of the translinear cell 402.

The first p-channel transistor ($M_{P1}$) 404 and the second p-channel transistor (MP2) 418 are arranged as a current mirror, resulting in the flow of the composite current ($I_{BIAS}$+$I_{SNS}$) flowing through the fourth NPN transistor ($Q_{N4}$) 414, where $$I_{BIAS} = \frac{V_{BIAS}}{R_{SNS}} \text{ and } I_{SNS} = \frac{V_{SNS}}{R_{SNS}}.$$

Through the translinear cell configuration, the output current ($I_{OUT}$) maintains proportionality to the sensing voltage ($V_{SNS}$) while eliminating dependence on the value of the resistive sensor ($R_{SNS}$) 106. The circuit processes signals in the current domain, enabling accurate measurement of sensor variations across temperature and manufacturing variations without requiring precise knowledge of the resistance value of the resistive sensor ($R_{SNS}$) 106.

Based on Kirchoff's voltage law (KVL), the sum of all voltage drops around any closed loop in a circuit equals zero: $V_{BE1}-V_{BE4}+V_{BE3}-V_{BE2}=0$, where $V_{BE1}$ is the base-to-emitter voltage ($V_{BE}$) of the first NPN transistor ($Q_{N1}$) 408, $V_{BE2}$ is the base-to-emitter voltage ($V_{BE}$) of the second NPN transistor ($Q_{N2}$) 410, $V_{BE3}$ is the base-to-emitter voltage ($V_{BE}$) of the third NPN transistor ($Q_{N3}$) 412, and $V_{BE4}$ is the base-to-emitter voltage ($V_{BE}$) of the fourth NPN transistor ($Q_{N4}$) 414.

For a bipolar transistor operating in the forward active region, $$V_{BE} = V_T \times \ln\left(\frac{I}{I_S}\right),$$

where $V_T$ is the thermal voltage (≈26 mV at room temperature), I is the collector current, and $I_S$ is the transistor saturation current.

In the translinear cell 402, $$V_T \times \ln\left(\frac{I_1}{I_{S1}}\right) - V_T \times \ln\left(\frac{I_4}{I_{S4}}\right) + V_T \times \ln\left(\frac{I_3}{I_{S3}}\right) - V_T \times \ln\left(\frac{I_2}{I_{S2}}\right),$$

which can be simplified to $$\frac{I_1}{I_2} - \frac{I_4}{I_3} = 0 \text{ or } \frac{I_1}{I_2} = \frac{I_4}{I_3},$$

where $I_1$ is equal to the cancelation current ($I_{DC\_CANC}$), $I_2$ is equal to $$\frac{I_{DAC}}{2} + I_{OUT}, I_3$$

is equal to $$\frac{I_{DAC}}{2} - I_{OUT},$$

and $I_4$ is equal to the composite current ($I_{BIAS}+I_{SNS}$).

Replacing $I_1$, $I_2$, $I_3$, and $I_4$ with their equivalent values, the equation above can be restated as:

$$\frac{I_{DC\_CANC}}{\frac{I_{DAC}}{2} + I_{OUT}} = \frac{I_{BIAS} + I_{SNS}}{\frac{I_{DAC}}{2} - I_{OUT}},$$

which can be reformulated as:

$$\left(I_{DC\_CANC} \times \frac{I_{DAC}}{2}\right) - (I_{DC\_CANC} \times I_{OUT}) = (I_{BIAS} + I_{SNS}) \times \frac{I_{DAC}}{2} + (I_{BIAS} + I_{SNS}) \times I_{OUT}.$$

Restating this equation for the output current:

$$I_{OUT} = \frac{(I_{DCCANC} - I_{BIAS} - I_{SNS}) \times \frac{I_{DAC}}{2}}{I_{DC\_CANC} + I_{BIAS} + I_{SNS}}.$$

The output current can be expressed as:

$$I_{OUT} = \frac{\left(\frac{V_{BIAS}}{R_{SNS}} - \frac{V_{BIAS}}{R_{SNS}} - \frac{V_{SNS}}{R_{SNS}}\right) \times \frac{\frac{V_{BIAS}}{R_P}}{2}}{\frac{V_{BIAS}}{R_{SNS}} + \frac{V_{BIAS}}{R_{SNS}} + \frac{V_{SNS}}{R_{SNS}}},$$

where $$I_{DC\_CANC} = I_{BIAS} = \frac{V_{BIAS}}{R_{SNS}}, I_{SNS} = \frac{V_{SNS}}{R_{SNS}}, \text{ and } I_{DAC} = \frac{V_{BIAS}}{R_P}.$$

The equation above can be simplified as:

$$I_{OUT} = \frac{\left(-\frac{V_{SNS}}{R_{SNS}}\right) \times \frac{\frac{V_{BIAS}}{R_P}}{2}}{\frac{2 \times V_{BIAS} + V_{SNS}}{R_{SNS}}} = -V_{SNS} \times \frac{\frac{V_{BIAS}}{2 \times R_P}}{2 \times V_{BIAS} + V_{SNS}} = -\frac{V_{SNS}}{4 \times R_P},$$

where $V_{SNS} \ll V_{BIAS}$, which is always true in this application.

Accordingly, by adding a resistive load equal to $4 \times R_P$, a constant gain (e.g., 1) is achieved for the sensing signal originating from the resistive sensor ($R_{SNS}$) 106 below the bias bandwidth, which is independent of the resistance value of the resistive sensor ($R_{SNS}$) 106. The constant gain can be greater than unity if the resistive load is greater than $4 \times R_P$. Further, as the gain is independent of temperature or process variations, it remains constant.

Accordingly, by monitoring the output current ($I_{OUT}$) and given the constant value for the resistive load (e.g., $4 \times R_P$), the sensing voltage ($V_{SNS}$) can be obtained. The sensing voltage ($V_{SNS}$) is varying with the temperature and it is used to determine how close the head is to the disk.

While the embodiment of FIG. 4 depicts NPN bipolar junction transistors in the various embodiments, PNP bipolar junction transistors or other active components that exhibit appropriate voltage-current relationships may be arranged in translinear configurations to achieve similar functionality. The voltage and current polarities, as well as the circuit topology, can be adjusted accordingly based on the type of active components selected while maintaining the underlying translinear principles described in the disclosure.

Figure 5:
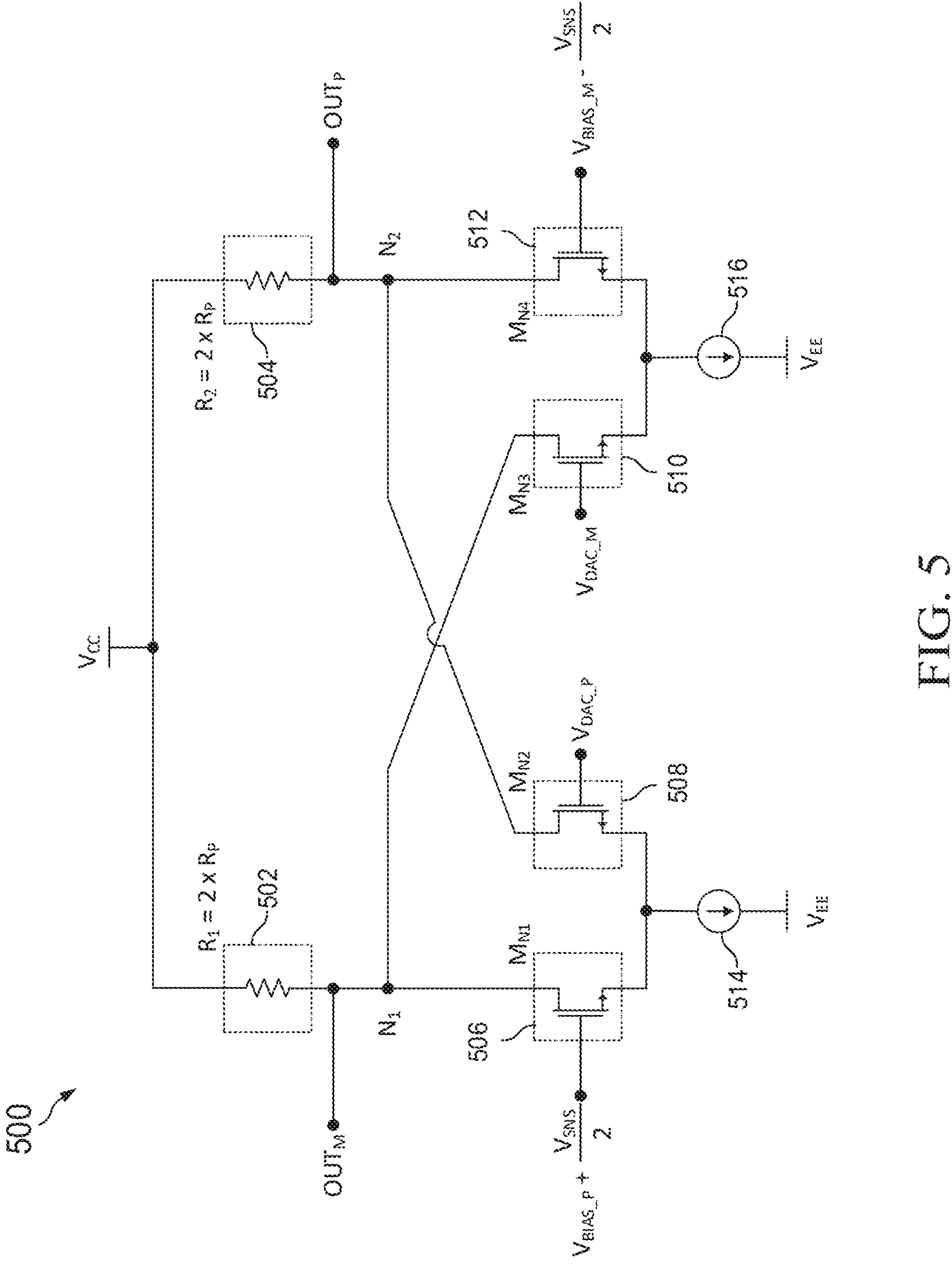
FIG. 5 is a schematic of an embodiment front-end circuit.

FIG. 5 illustrates a schematic of an embodiment front-end circuit 500, which may be implemented as the front-end circuit 202. The front-end circuit 500 includes a first resistor ($R_1$) 502, a second resistor ($R_2$) 504, a first n-channel transistor ($M_{N1}$) 506, a second n-channel transistor ($M_{N2}$) 508, a third n-channel transistor ($M_{N3}$) 510, a fourth n-channel transistor ($M_{N4}$) 512, a first current source 514, and a second current source 516, which may (or may not) be arranged as shown. Front-end circuit 500 may include additional components not shown.

The front-end circuit 500 operates between the first supply voltage ($V_{OC}$) and the second supply voltage ($V_{EE}$). The first resistor ($R_1$) 502 couples between the first supply voltage and a first output node ($OUT_M$), while the second resistor ($R_2$) 504 couples between the first supply voltage and a second output node ($OUT_P$). This differential output is provided by a differential output current that maintains proportionality to sensor signals while canceling bias effects through the translinear cell operation.

Further, it should be appreciated that the programmable cancelation current ($I_{DC\_CANC}$) equals the bias current ($I_{BIAS}$) when the output voltage at the first output node ($OUT_M$) is equal to the output voltage at the second output node ($OUT_P$). Accordingly, the value of the cancelation current ($I_{DC\_CANC}$) can be programmed to be equal to the bias current ($I_{BIAS}$) when this condition is set and the translinear cell 402 is balanced.

The front-end circuit 500, through the first and second output nodes, provides differential signals to the low-pass filter 204. The resistance value of the first resistor ($R_1$) 502 and the second resistor ($R_2$) 504 is equal to a resistance of $R_1 = R_{2=2} \times R_P$.

The first n-channel transistor ($M_{N1}$) 506 and the second n-channel transistor ($M_{N2}$) 508 form a first differential pair, while the third n-channel transistor ($M_{N3}$) 510 and the fourth n-channel transistor ($M_{N4}$) 512 form a second differential pair. The first current source 514 provides a first bias current for the first differential pair, while the second current source 516 provides a second bias current for the second differential pair.

The gate terminals of the first n-channel transistor ($M_{N1}$) 506 and the fourth n-channel transistor ($M_{N4}$) 512 receive control signals that combine bias and sensor information. The first n-channel transistor ($M_{N1}$) 506 receives a first control signal equal to $$V_{BIAS\_P} + \frac{V_{SNS}}{2},$$

while the fourth n-channel transistor ($M_{N4}$) 512 receives a second control signal equal to $$V_{BIAS\_M} + \frac{V_{SNS}}{2}.$$

The second n-channel transistor ($M_{N2}$) 508 receives a third control signal equal to $V_{DAC\_P}$ and the third n-channel transistor ($M_{N3}$) 510 receives a fourth control signal equal to $V_{DAC\_M}$, Where $V_{DAC}=V_{DAC\_P}-V_{DAC\_M}$ and $V_{BIAS}=V_{BIAS\_P}-V_{BIAS\_M}$, where $V_{BIAS}$ is the bias voltage across the resistive sensor ($R_{SNS}$) 106 and is equal to $V_{DAC}$ (i.e., $V_{DAC}=V_{BIAS}$).

The drain terminals of the first n-channel transistor ($M_{N1}$) 506 and the third n-channel transistor ($M_{N3}$) 510 are coupled to the first output node ($N_1$). In contrast, the drain terminals of the second n-channel transistor ($M_{N2}$) 508 and the fourth n-channel transistor ($M_{N4}$) 512 are coupled to the second output node ($N_2$).

Accordingly, the architecture proposes a signal elaboration path based on a translinear cell. By reading the bias current from the resistive sensor through the bias stage, the translinear cell enables signal management within the bias bandwidth. By combining generated currents, the system cancels DC bias values applied to the resistive sensor, preventing saturation at the output of gain stages. Further, it maintains constant gain independent of resistive sensor value. Additionally, the architecture provides flat bandwidth response across all operating frequencies.

Figure 6:
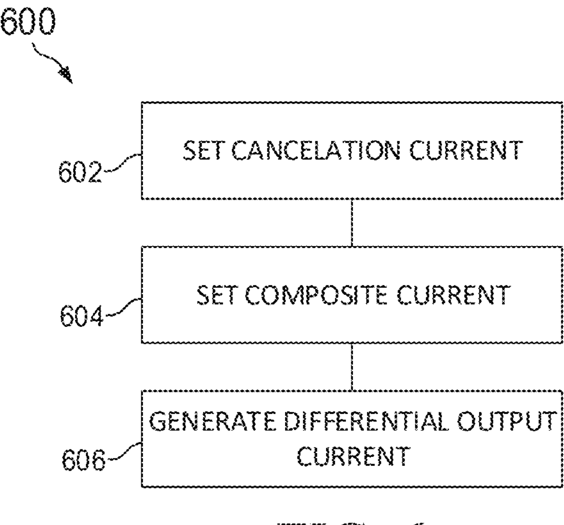
FIG. 6 is a flowchart of an embodiment method for processing signals from a resistive sensor using a translinear cell.

FIG. 6 illustrates a flowchart of an embodiment method 600 for processing signals from a resistive sensor using a translinear cell. It is noted that all steps outlined in method 600 are not necessarily required and can be optional. Further, changes to the arrangement of the steps, removal of one or more steps and path connections, and addition of steps and path connections are similarly contemplated.

At step 602, a bias-canceling digital-to-analog converter generates a cancelation current. The cancelation current can be set by monitoring the differential output voltage between the first and second output nodes of the translinear cell. When these differential outputs are balanced (equal to zero), the cancelation current matches the bias current flowing through the resistive sensor.

In embodiments, the bias-canceling digital-to-analog converter adjusts the cancelation current through an iterative process where the differential output is monitored and the cancelation current is incrementally adjusted until the differential output reaches zero. This calibration process ensures accurate bias cancelation without requiring direct measurement of the bias current.

The cancelation current is provided to a first NPN transistor of a translinear cell. The translinear cell includes the first NPN transistor coupled to receive the cancelation current, a second NPN transistor coupled to a first output node, a third NPN transistor coupled to a second output node, and a fourth NPN transistor receiving the current bias through a current mirror composed by p-channel transistors.

At step 604, a composite current is provided to the fourth NPN transistor through the current mirror arrangement with the p-channel transistors. The composite current combines two components: the bias current established by the biasing operational amplifier across the resistive sensor, and the sensor signal current representing variations in the sensor resistance due to changes in thermal conductivity.

The bias current component corresponds to the DC operating point set by the bias voltage across the resistive sensor, while the sensor signal current represents the dynamic changes in resistance as the head-to-disk spacing varies. The current mirror formed by the fourth NPN transistor and p-channel transistor ensures accurate copying of this composite current for processing by the translinear cell.

At step 606, the translinear cell generates a differential output current between the first and second output nodes based on the cancelation current and the composite current. The differential output current maintains proportionality to a sensing voltage across the resistive sensor while eliminating dependence on the resistance value of the resistive sensor.

Figure 7:
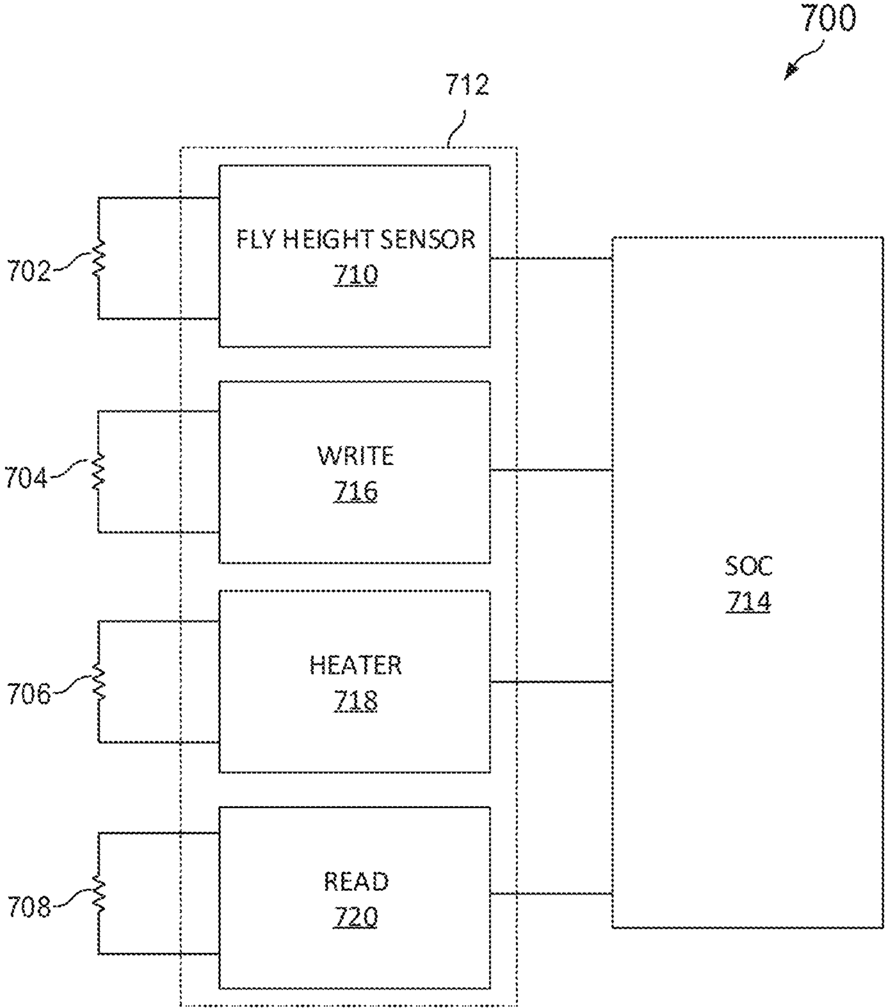
FIG. 7 is a block diagram of a pre-amplifier that is placed on the disk drive head stack assembly of a hard disk drive.

FIG. 7 illustrates a block diagram of a pre-amplifier 712 that is placed on the disk drive head stack assembly of a hard disk drive. In embodiments, pre-amplifier 712 includes the circuit 300.

The disk drive head stack assembly slides over the disk. The pre-amplifier 712 includes a fly height sensor 710. In embodiments, the fly height sensor 710 includes a biasing circuit and an amplifier (not shown). The fly height sensor 710 is coupled to a resistive sensor 702, which may be implemented as the resistive sensor ($R_{SNS}$) 106. The resistive sensor 702 monitors the fly height between the disk drive head and the disk itself.

A write resistor 704 is coupled to the write circuit 716 (for writing to the disk), a heater resistor 706 is coupled to the heater circuit 718 (for controlling the fly height spacing), and a read resistor 708 is coupled to the read circuit 720 (for reading from the disk). The fly height sensor 710, write circuit 716, heater circuit 718, and read circuit 720 are coupled to a system-on-chip (SoC) 714 for processing.

A first aspect relates to a system for processing signals from a resistive sensor that monitors spacing between a disk drive head and a disk surface, the system comprising a bias-canceling digital-to-analog converter configured to generate a cancelation current, the cancelation current equal to a bias current across the resistive sensor; and a translinear cell configured to receive the cancelation current and a composite current comprising the bias current and a sensor signal current, wherein the sensor signal current corresponds to variations in thermal conductivity as the disk drive head approaches the disk surface, and generate an output current proportional to a sensing voltage across the resistive sensor to eliminate dependence on resistance value of the resistive sensor.

In a first implementation form of the system, according to the first aspect as such, the system further comprising a front-end circuit configured to receive differential output currents from the translinear cell and combine the differential output currents with signals coupled from sensor nodes at frequencies above a bias loop bandwidth.

In a second implementation form of the system, according to the first aspect as such or any preceding implementation form of the first aspect, the cancelation current equals the bias current in response to differential outputs of the front-end circuit being balanced.

In a third implementation form of the system, according to the first aspect as such or any preceding implementation form of the first aspect, the system further comprising a low-pass filter configured to receive differential output voltages of the front-end circuit; and a gain stage coupled to the low-pass filter, wherein the gain stage is configured to amplify filtered signals while maintaining linear operation.

In a fourth implementation form of the system, according to the first aspect as such or any preceding implementation form of the first aspect, the system further comprising a biasing operational amplifier configured to establish a bias voltage across the resistive sensor through a voltage feedback loop.

In a fifth implementation form of the system, according to the first aspect as such or any preceding implementation form of the first aspect, the system further comprising a current source coupled between the bias-canceling digital-to-analog converter and the translinear cell.

In a sixth implementation form of the system, according to the first aspect as such or any preceding implementation form of the first aspect, the output current maintains constant gain independent of temperature variations of the resistive sensor.

A second aspect relates to a circuit for monitoring spacing between a disk drive head and a disk surface using a resistive sensor that detects variations in thermal conductivity as the disk drive head approaches the disk surface, the circuit comprising a first transistor configured to receive a cancelation current, wherein the cancelation current is equal to a bias current flowing through the resistive sensor; a second transistor and a third transistor coupled to a first output node and a second output node, respectively; and a fourth transistor receiving a composite current comprising the bias current and a sensor signal current from the resistive sensor, wherein the first transistor, the second transistor, the third transistor, and the fourth transistor are arranged in a translinear configuration to generate differential output currents proportional to a sensing voltage while eliminating dependence on resistance value of the resistive sensor.

In a first implementation form of the circuit, according to the second aspect as such, the differential output currents are provided to a front-end circuit that combines the differential output currents with signals coupled directly from sensor nodes at frequencies above a bias loop bandwidth.

In a second implementation form of the circuit, according to the second aspect as such or any preceding implementation form of the second aspect, the cancelation current equals the bias current in response to differential outputs of the front-end circuit being balanced.

In a third implementation form of the circuit, according to the second aspect as such or any preceding implementation form of the second aspect, the circuit is coupled to a bias-canceling digital-to-analog converter through a current source, the bias-canceling digital-to-analog converter configured to generate the cancelation current.

In a fourth implementation form of the circuit, according to the second aspect as such or any preceding implementation form of the second aspect, the circuit is coupled to a biasing operational amplifier configured to establish a bias voltage across the resistive sensor through a voltage feedback loop.

In a fifth implementation form of the circuit, according to the second aspect as such or any preceding implementation form of the second aspect, base-emitter voltages of the first transistor, the second transistor, the third transistor, and the fourth transistor satisfy Kirchoff's voltage law around a closed loop to maintain constant gain independent of temperature variations.

In a sixth implementation form of the circuit, according to the second aspect as such or any preceding implementation form of the second aspect, the circuit further comprising a current source configured to generate a reference current proportional to a ratio of a bias voltage to a reference resistance.

A third aspect relates to a method for monitoring spacing between a disk drive head and a disk surface using a resistive sensor, the method comprising establishing a bias voltage across the resistive sensor through a voltage feedback loop to generate a bias current; generating a cancelation current equal to the bias current; receiving, at a translinear cell, the cancelation current and a composite current comprising the bias current and a sensor signal current, wherein the sensor signal current corresponds to variations in thermal conductivity as the disk drive head approaches the disk surface; generating, by the translinear cell, differential output currents proportional to a sensing voltage across the resistive sensor while eliminating dependence on resistance value of the resistive sensor; and processing the differential output currents to determine the spacing between the disk drive head and the disk surface.

In a first implementation form of the method, according to the third aspect as such, processing the differential output currents comprises combining, in a front-end circuit, the differential output currents with signals coupled directly from sensor nodes at frequencies above a bias loop bandwidth.

In a second implementation form of the method, according to the third aspect as such or any preceding implementation form of the third aspect, the method further comprising adjusting the cancelation current until differential outputs of the front-end circuit are balanced.

In a third implementation form of the method, according to the third aspect as such or any preceding implementation form of the third aspect, the method further comprising filtering the differential outputs of the front-end circuit using a low-pass filter; and amplifying the filtered signals using a gain stage while maintaining linear operation.

In a fourth implementation form of the method, according to the third aspect as such or any preceding implementation form of the third aspect, generating the differential output currents comprises processing the currents through transistors arranged in a translinear configuration that maintains constant gain independent of temperature variations.

In a fifth implementation form of the method, according to the third aspect as such or any preceding implementation form of the third aspect, the method further comprising generating a reference current proportional to a ratio of the bias voltage to a reference resistance.

Although the description has been described in detail, it should be understood that various changes, substitutions, and alterations may be made without departing from the spirit and scope of this disclosure as defined by the appended claims. The same elements are designated with the same reference numbers in the various figures. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

The specification and drawings are, accordingly, to be regarded simply as an illustration of the disclosure as defined by the appended claims, and are contemplated to cover any and all modifications, variations, combinations, or equivalents that fall within the scope of the present disclosure.

What is claimed is:

1. A system for processing signals from a resistive sensor that monitors spacing between a disk drive head and a disk surface, the system comprising:
- a bias-canceling digital-to-analog converter configured to generate a cancelation current, the cancelation current equal to a bias current across the resistive sensor; and
- a translinear cell configured to:
  - receive the cancelation current and a composite current comprising the bias current and a sensor signal current, wherein the sensor signal current corresponds to variations in thermal conductivity as the disk drive head approaches the disk surface, and
  - generate an output current proportional to a sensing voltage across the resistive sensor to eliminate dependence on resistance value of the resistive sensor.

2. The system of claim 1, further comprising a front-end circuit configured to receive differential output currents from the translinear cell and combine the differential output currents with signals coupled from sensor nodes at frequencies above a bias loop bandwidth.

3. The system of claim 2, wherein the cancelation current equals the bias current in response to differential outputs of the front-end circuit being balanced.

4. The system of claim 2, further comprising:
- a low-pass filter configured to receive differential output voltages of the front-end circuit; and
- a gain stage coupled to the low-pass filter, wherein the gain stage is configured to amplify filtered signals while maintaining linear operation.

5. The system of claim 1, further comprising a biasing operational amplifier configured to establish a bias voltage across the resistive sensor through a voltage feedback loop.

6. The system of claim 1, further comprising a current source coupled between the bias-canceling digital-to-analog converter and the translinear cell.

7. The system of claim 1, wherein the output current maintains constant gain independent of temperature variations of the resistive sensor.

8. A circuit for monitoring spacing between a disk drive head and a disk surface using a resistive sensor that detects variations in thermal conductivity as the disk drive head approaches the disk surface, the circuit comprising:
- a first transistor configured to receive a cancelation current, wherein the cancelation current is equal to a bias current flowing through the resistive sensor;
- a second transistor and a third transistor coupled to a first output node and a second output node, respectively; and
- a fourth transistor receiving a composite current comprising the bias current and a sensor signal current from the resistive sensor,
- wherein the first transistor, the second transistor, the third transistor, and the fourth transistor are arranged in a translinear configuration to generate differential output currents proportional to a sensing voltage while eliminating dependence on resistance value of the resistive sensor.

9. The circuit of claim 8, wherein the differential output currents are provided to a front-end circuit that combines the differential output currents with signals coupled directly from sensor nodes at frequencies above a bias loop bandwidth.

10. The circuit of claim 9, wherein the cancelation current equals the bias current in response to differential outputs of the front-end circuit being balanced.

11. The circuit of claim 8, wherein the circuit is coupled to a bias-canceling digital-to-analog converter through a current source, the bias-canceling digital-to-analog converter configured to generate the cancelation current.

12. The circuit of claim 8, wherein the circuit is coupled to a biasing operational amplifier configured to establish a bias voltage across the resistive sensor through a voltage feedback loop.

13. The circuit of claim 8, wherein base-emitter voltages of the first transistor, the second transistor, the third transistor, and the fourth transistor satisfy Kirchoff's voltage law around a closed loop to maintain constant gain independent of temperature variations.

14. The circuit of claim 8, further comprising a current source configured to generate a reference current proportional to a ratio of a bias voltage to a reference resistance.

15. A method for monitoring spacing between a disk drive head and a disk surface using a resistive sensor, the method comprising:
- establishing a bias voltage across the resistive sensor through a voltage feedback loop to generate a bias current;
- generating a cancelation current equal to the bias current;
- receiving, at a translinear cell, the cancelation current and a composite current comprising the bias current and a sensor signal current, wherein the sensor signal current corresponds to variations in thermal conductivity as the disk drive head approaches the disk surface;
- generating, by the translinear cell, differential output currents proportional to a sensing voltage across the resistive sensor while eliminating dependence on resistance value of the resistive sensor; and
- processing the differential output currents to determine the spacing between the disk drive head and the disk surface.

16. The method of claim 15, wherein processing the differential output currents comprises combining, in a front-end circuit, the differential output currents with signals coupled directly from sensor nodes at frequencies above a bias loop bandwidth.

17. The method of claim 16, further comprising adjusting the cancelation current until differential outputs of the front-end circuit are balanced.

18. The method of claim 16, further comprising:
- filtering the differential outputs of the front-end circuit using a low-pass filter; and
- amplifying the filtered signals using a gain stage while maintaining linear operation.

19. The method of claim 15, wherein generating the differential output currents comprises processing the currents through transistors arranged in a translinear configuration that maintains constant gain independent of temperature variations.

20. The method of claim 15, further comprising generating a reference current proportional to a ratio of the bias voltage to a reference resistance.

* * * * *